(12) United States Patent
Yang

(10) Patent No.: US 8,607,996 B2
(45) Date of Patent: Dec. 17, 2013

(54) SERVER CABINET AND SERVER CABINET ASSEMBLY

(75) Inventor: Feng-Chi Yang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 26 days.

(21) Appl. No.: 13/425,395

(22) Filed: Mar. 20, 2012

(65) Prior Publication Data

US 2013/0214654 A1 Aug. 22, 2013

(30) Foreign Application Priority Data

Feb. 17, 2012 (CN) .......................... 2012 1 0035983

(51) Int. Cl.
*A47F 5/00* (2006.01)
(52) U.S. Cl.
USPC .......................................... 211/162; 312/201
(58) Field of Classification Search
USPC ............ 211/1.57, 26, 85.8, 126.15, 151, 162; 312/201, 270.3, 334.23, 334.24, 312/334.27, 334.28, 350; 361/724, 725, 361/726, 727; 414/267, 331.06
See application file for complete search history.

(56) References Cited

U.S. PATENT DOCUMENTS

| | | | | |
|---|---|---|---|---|
| 2,174,260 A | * | 9/1939 | Foulkes | 312/201 |
| 2,857,558 A | * | 10/1958 | Fiske | 361/727 |
| 2,915,195 A | * | 12/1959 | Crosby | 312/199 |
| 3,456,826 A | * | 7/1969 | Pavlik | 414/498 |
| 3,923,354 A | * | 12/1975 | Young | 312/201 |
| 3,973,685 A | * | 8/1976 | Loomer | 414/273 |
| 4,498,123 A | * | 2/1985 | Fuss et al. | 361/825 |
| 4,608,621 A | * | 8/1986 | Porter | 361/827 |
| 4,618,191 A | * | 10/1986 | Peterman | 312/201 |
| 5,443,312 A | * | 8/1995 | Schluter | 312/334.27 |
| 6,027,190 A | * | 2/2000 | Stewart et al. | 312/201 |
| 6,102,500 A | * | 8/2000 | Chen | 312/223.2 |
| 6,112,917 A | * | 9/2000 | Baker et al. | 211/162 |
| 6,158,601 A | * | 12/2000 | Baker et al. | 211/162 |
| 6,231,138 B1 | * | 5/2001 | Janson | 312/201 |
| 6,669,314 B1 | * | 12/2003 | Nemec et al. | 312/201 |
| 6,682,159 B2 | * | 1/2004 | Compagnucci | 312/334.24 |
| 6,709,225 B1 | * | 3/2004 | Pitts et al. | 414/787 |
| 7,484,631 B2 | * | 2/2009 | Bothun et al. | 211/162 |
| 7,688,578 B2 | * | 3/2010 | Mann et al. | 361/679.46 |
| 8,056,988 B2 | * | 11/2011 | Pan | 312/201 |
| 2002/0140329 A1 | * | 10/2002 | Compagnucci | 312/334.24 |
| 2008/0006593 A1 | * | 1/2008 | Tenreiro et al. | 211/162 |
| 2009/0179532 A1 | * | 7/2009 | Pan | 312/201 |

* cited by examiner

*Primary Examiner* — Joshua Rodden
(74) *Attorney, Agent, or Firm* — Altis Law Group, Inc.

(57) ABSTRACT

A server cabinet assembly includes a number of chassis arranged on a floor in a row, a sliding rail mounted on the floor, a sliding plate slidably supported on the rail, and a supporting frame to accommodate servers. Each chassis includes a bottom wall defining a pair of sliding slots perpendicular to the sliding rail. The sliding plate defines a pair of slots in a top surface thereof. The supporting frame includes a bottom plate, and a number of rollers mounted to the bottom plate. When the sliding plate is slid along the rail to one of the chassis, and the slots of the sliding plate align with the sliding slots of the one of the chassis, the rollers slide on the slots of the sliding plate and the sliding slots of the chassis to move the supporting frame in or out of the chassis.

7 Claims, 5 Drawing Sheets

SERVER CABINET AND SERVER CABINET ASSEMBLY

BACKGROUND

1. Technical Field

The present disclosure relates to a server cabinet and a server cabinet assembly.

2. Description of Related Art

Many server cabinets are often secured on the floor of a room and a number of servers are received in each server cabinet. However, more often than not, a space of the room is limited, and the server cabinets are tightly arranged within the room. It is inconvenient to install or move the sever cabinets or servers when maintenance or replacement of the servers is needed.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references can mean "at least one."

Figure 1:
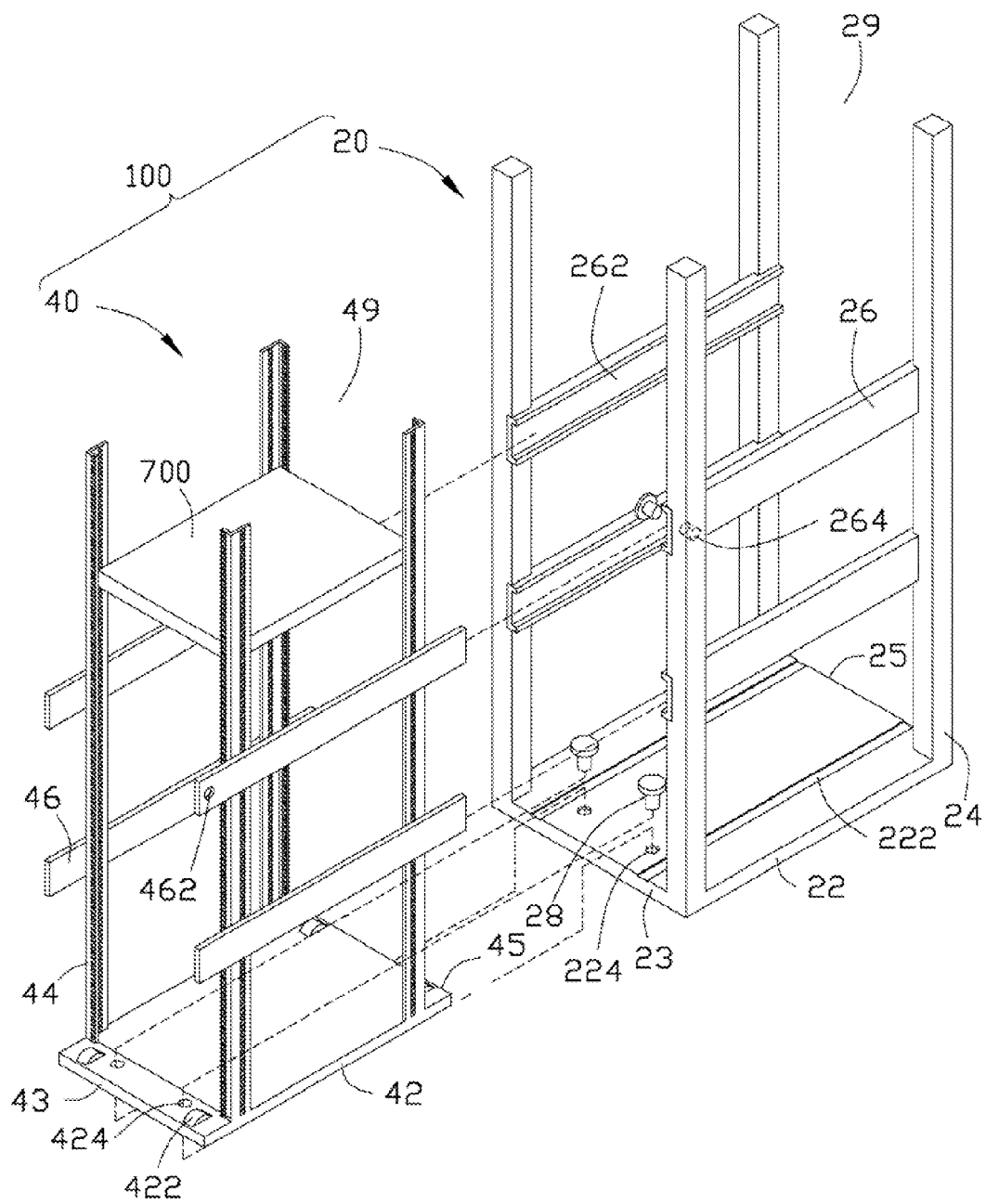
FIG. 1 is an exploded, isometric view of an embodiment of a sever cabinet.
Figure 2:
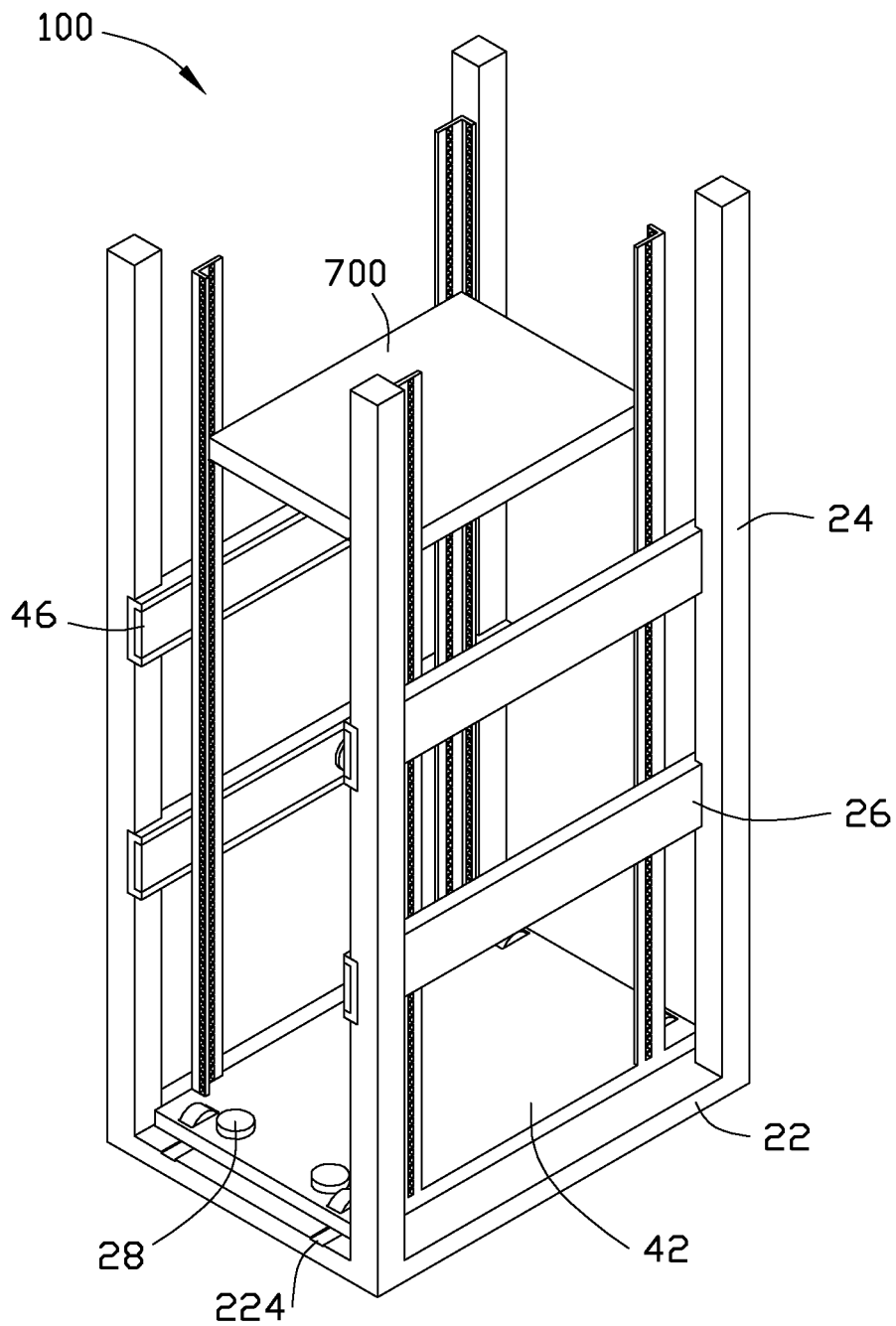
FIG. 2 is an assembled view of FIG. 1.

Referring to FIG. 1, an exemplary embodiment of a server cabinet 100 includes a chassis 20 and a supporting frame 40.

The chassis 20 includes a rectangular bottom wall 22, two pairs of supporting poles 24 substantially perpendicularly extending up from two opposite sides of the bottom wall 22, two parallel guiding rails 26 attached to an inner side of each pair of the supporting poles 24, and a plurality of screws 28. The bottom wall 22 and the supporting poles 24 cooperatively bound a receiving space 29.

The bottom wall 22 includes a first end 23 and a second end 25 opposite to the first end 23. A top surface of the bottom wall 22 defines two spaced sliding slots 222 parallel to a lengthwise direction of the bottom wall 22. The first end 23 of the bottom wall 22 defines two screw holes 224 between the sliding slots 222.

An inner surface of each guiding rail 26 defines a guiding slot 262 parallel to an extending direction of the sliding slots 222, and the guiding slot 262 communicates with the receiving space 29. An end of one of the guiding rail 26 adjacent to the screw holes 224 defines a screw hole 264.

The supporting frame 40 includes a rectangular bottom plate 42, two pairs of fixing poles 44 substantially perpendicularly extending up from two opposite sides of the bottom plate 42, two parallel connecting bars 46 attached on an outer side of each pair of the fixing poles The bottom plate 42 and the fixing poles 44 cooperatively bound an assembly space 49 for assembling a plurality of servers 700. Each connecting bar 46 is substantially parallel to a lengthwise direction of the bottom plate 42. Four rollers 422 are respectively installed at four corners of a bottom surface of the bottom plate 42. The bottom plate includes a first end 43 defining two through holes 424 between the rollers 422, and a second end 45 opposite to the first end 43. An end of one connecting bar 46 defines a fastening hole 462 adjacent to the through holes 424.

Figure 3:
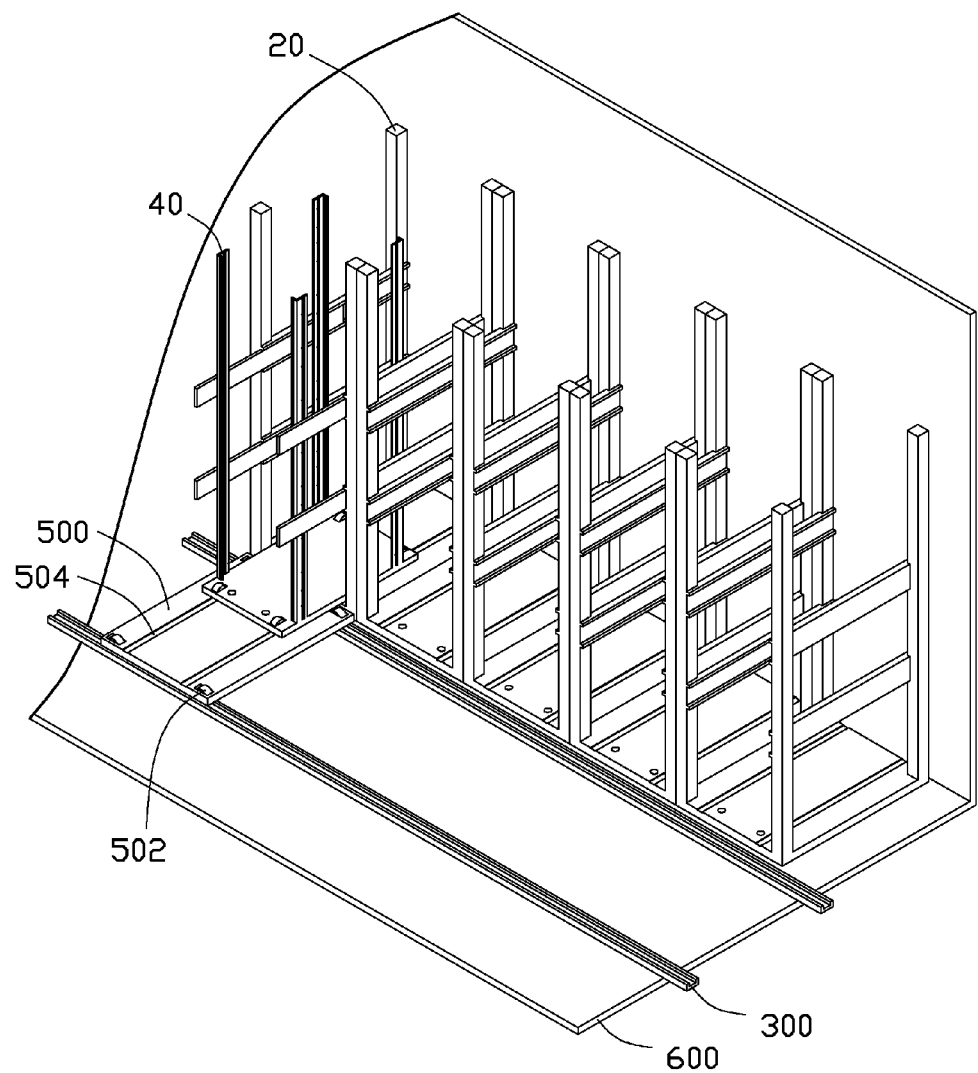
FIG. 3-5 are isometric views of the server cabinets, showing different states of use.

Referring to FIG. 3, in assembling the supporting frame 40 into the chassis 20, the second end 45 of the supporting frame 40 is inserted into the chassis 20 from the first end 23 of the chassis 20, each roller 422 is rotatably received in the corresponding sliding slot 222, each connecting bar 46 is slidably inserted into the corresponding guiding slot 262, until the though holes 424 aligning with the corresponding screw hole 224, and the fastening hole 462 aligning with the screw hole 264. Two screws 28 extend though the through holes 424, to be screwed into the corresponding screw holes 224. The screw 28 extends through the fastening hole 462, to be screwed into the screw hole 264.

In detaching the supporting frame 40 from the chassis 20, the screws 28 are unscrewed from the screw holes 224, 264 to disengage the chassis 20. The supporting frame 40 can be easily removed from the chassis 20 via the rollers 422 rotating in the sliding slot 22.

Figure 4:
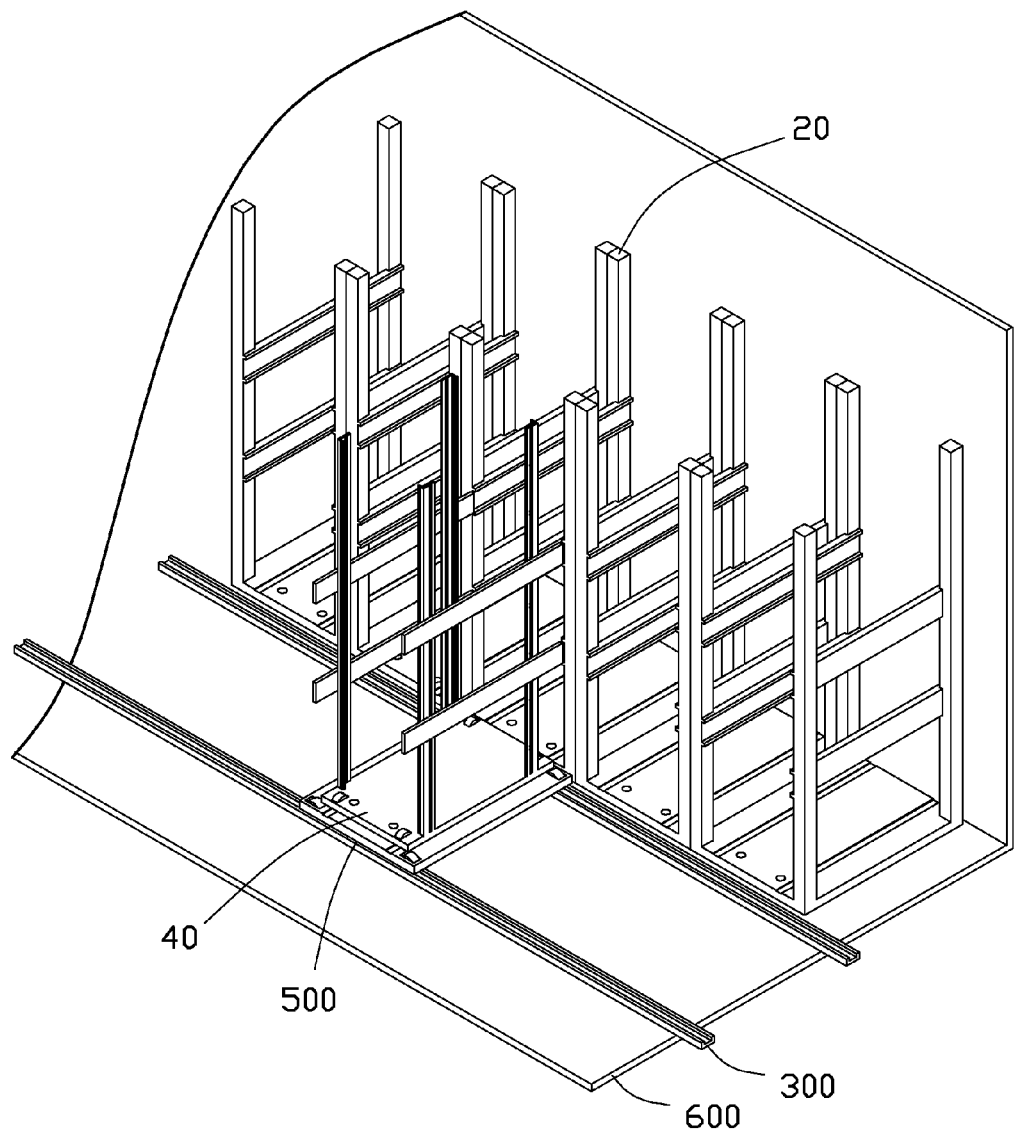
Figure 5:
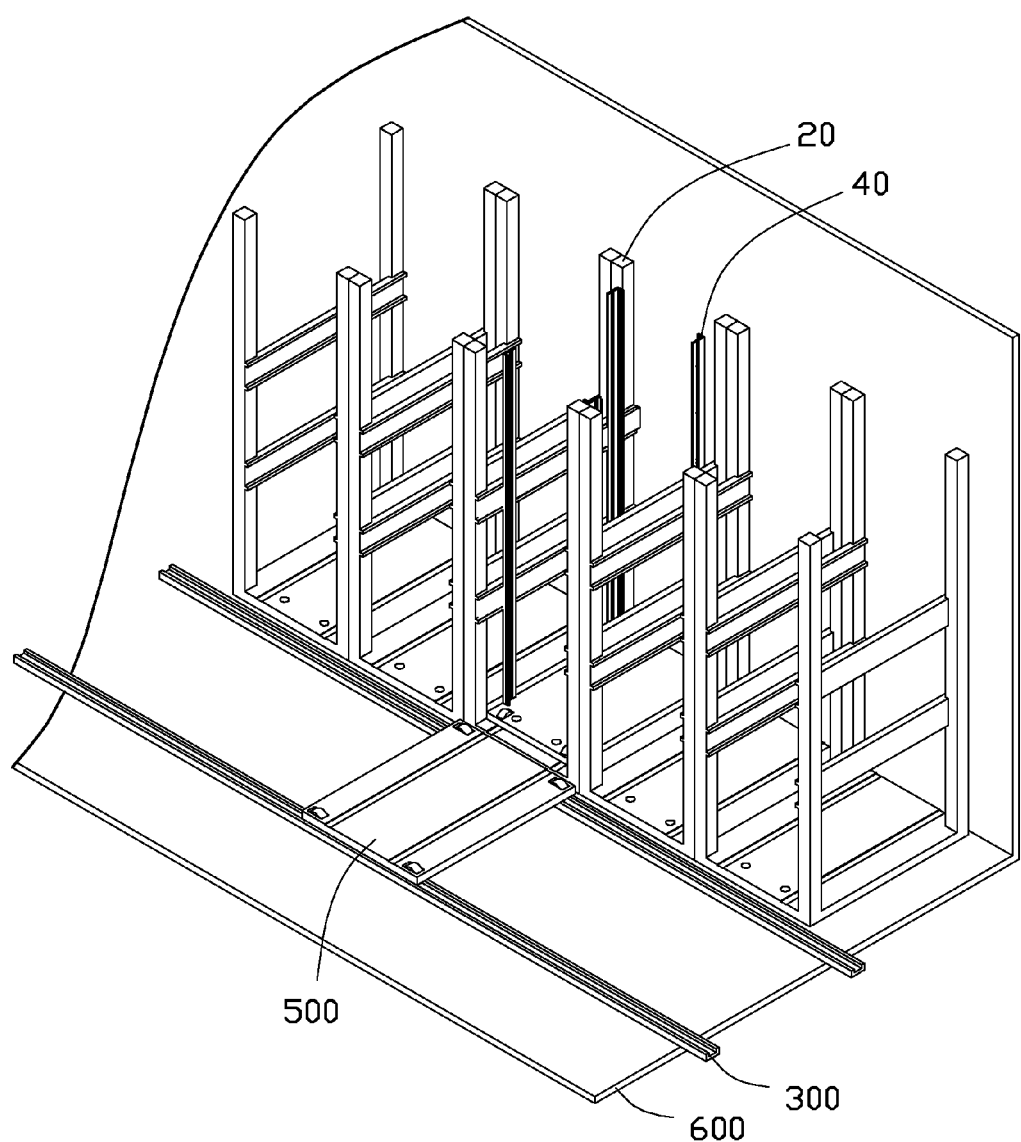

Referring also to FIGS. 3-5, in use, many server cabinets 100 are arranged on a floor 600 of a room, with the first ends 23 of the chassis 20 aligned in a row. Two parallel sliding rails 300 are mounted on the floor 600 adjacent to and parallel with the first ends 23 of the chassis 20, and the sliding slot 222 of each chassis 20 is substantially perpendicular to the sliding rails 300. A rectangular sliding plate 500 is slidably supported on the sliding rails 300. Four rollers 502 are respectively installed at four corners of a bottom of the sliding plate 500, with each roller 502 rotatably received in the corresponding sliding rail 300. A top surface of the sliding plate 500 defines two parallel slots 504 along a direction perpendicular to an extending direction of the sliding rails 300. A distance between the slots 504 is equal to a distance between the sliding slots 222 of each chassis 20.

In installing the supporting frame 40 to one of the chassis 20, the supporting frame 40 is placed on the sliding plate 500, with the rollers 422 rotatably received in the corresponding slots 504. The sliding plate 500 is moved along the sliding rail 300 through the rollers 502, until the slots 504 align with the sliding slots 222 of the chassis 20. The supporting frame 40 is pushed into the receiving space 29 of the chassis 20, with the rollers 422 rotating from the slots 504 of the sliding plate 500 to the corresponding sliding slots 222 of the chassis 20. The screws 28 respectively extend through the though holes 424 and the fastening hole 462, to be screwed into the corresponding screw holes 224, 264.

While the disclosure describes examples and embodiments, it is to be understood that the disclosure is not limited thereto. To the contrary, the disclosure is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A server cabinet comprising:
   a chassis arranged on a floor, and comprising a bottom wall supported on the floor, and a pair of sliding slots defined in a top surface of the bottom wall; and
   a supporting frame to accommodate a plurality of servers, the supporting frame slidably received in the chassis, and comprising a bottom plate, wherein a plurality of rollers is mounted to the bottom plate, and the rollers are rotatable in the sliding slots to readily install or remove the supporting frame in or from the chassis;

wherein the bottom wall of the chassis is rectangular, two pairs of supporting poles perpendicularly extend up from two opposite side of the bottom wall; the bottom plate of the supporting frame is rectangular, two pairs of fixing poles perpendicularly extend up from two opposite sides of the bottom plate, a rail is attached to one pair of the two pairs of supporting poles, and a connecting bar is attached to one pair of the two pairs of fixing poles to be slidably received in the rail.

2. The server cabinet of claim 1, wherein an end of the rail defines a screw hole, an end of the connecting bar defines a fastening hole, and a screw extends through the fastening hole, to be screwed into the screw hole.

3. The server cabinet of claim 1, wherein of the bottom wall defines a screw hole, an end of the bottom plate defines a through hole, and a screw extends through the through hole, to be screwed into the screw hole.

4. A server cabinet assembly comprising:
   a plurality of chassis arranged on a floor in a row, wherein each of the chassis comprises a bottom wall defining a pair of sliding slots;
   a sliding rail mounted on the floor perpendicular to an extending direction of the sliding slots of each of the chassis;
   a sliding plate slidably supported on the sliding rail, the sliding plate defining a pair of slots in a top surface thereof; and
   a supporting frame to accommodate a plurality of servers, the supporting frame comprising a bottom plate, and a plurality of rollers mounted to the bottom plate; wherein when the sliding plate is slid along the sliding rail to one of the chassis, and the slots of the sliding plate align with the sliding slots of the one of the chassis, the rollers slide on the slots of the sliding, plate and the sliding slots of the chassis to move the supporting frame in or out of the chassis.

5. The server cabinet assembly of claim 4, wherein the bottom wall of the chassis is rectangular, two pairs of supporting poles perpendicularly extend up from two opposite sides of the bottom wall, the bottom plate of the supporting, frame is rectangular, two pairs of fixing poles perpendicularly extend up from two opposite sides of the bottom plate, a guiding rail is attached to one pair of the two pairs of supporting poles, and a connecting bar is attached to one pair of the two pairs of fixing poles to be slidably received in the guiding rail.

6. The server cabinet assembly of claim 5, wherein an end of the guiding rail defines a screw hole, an end of the connecting bar defines a fastening hole, and a screw extends through the fastening hole, to be screwed into the screw hole.

7. The server cabinet assembly of claim 4, wherein an end of the bottom wall defines a screw hole, an end of the bottom plate defines a through hole, and a screw extends through the through hole, to be screwed into the screw hole.

\* \* \* \* \*